United States Patent
Sarda

(10) Patent No.: US 11,777,703 B2
(45) Date of Patent: *Oct. 3, 2023

(54) PHASE TRANSPORT WITH FREQUENCY TRANSLATION WITHOUT A PLL

(71) Applicant: Skyworks Solutions, Inc., Irvine, CA (US)

(72) Inventor: Vivek Sarda, Austin, TX (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/703,563

(22) Filed: Mar. 24, 2022

(65) Prior Publication Data

US 2022/0216981 A1 Jul. 7, 2022

Related U.S. Application Data

(63) Continuation of application No. 16/849,036, filed on Apr. 15, 2020, now Pat. No. 11,290,250.

(51) Int. Cl.
| | |
|---|---|
| *H04L 7/04* | (2006.01) |
| *H04L 7/033* | (2006.01) |
| *H03L 7/08* | (2006.01) |

(52) U.S. Cl.
CPC ............. *H04L 7/04* (2013.01); *H03L 7/08* (2013.01); *H04L 7/0331* (2013.01)

(58) Field of Classification Search
CPC . H03L 7/08; H04L 7/0331; H04L 7/00; H04L 7/08; H04L 7/04

(Continued)

(56) References Cited

U.S. PATENT DOCUMENTS

| | | |
|---|---|---|
| 5,140,611 A | 8/1992 | Jones |
| 5,509,038 A | 4/1996 | Wicki |

(Continued)

FOREIGN PATENT DOCUMENTS

| | | |
|---|---|---|
| CN | 102291233 | 12/2011 |
| CN | 103684727 | 3/2014 |

(Continued)

OTHER PUBLICATIONS

NXP Semiconductors, AN-12149, Implementing an IEEE 1588 V2 on i.MX RT Using PTPd, FreeRTOS, and lwIP TCP/IP stack, Sep. 2018 (Year 2018) 28 pages.

(Continued)

*Primary Examiner* — Emmanuel Bayard
(74) *Attorney, Agent, or Firm* — Knobbe, Martens, Olson & Bear, LLP

(57) ABSTRACT

A line card in a network box receives a SyncE clock signal and an input synchronization (SYNC) signal. A phase-lock loop (PLL) in the line card receives the SyncE clock signal as a reference clock signal and generates an output SyncE clock signal. The line card regenerates a SYSCLK signal using a digitally controlled oscillator that receives a timing signal from the SyncE PLL and receives a control signal from control logic on the line card. The frequency and phase information contained in the SYNC signal is utilized to control the DCO. The SYSCLK signal is divided to generate an output SYNC signal. The control logic uses the time difference between the input SYNC signal and a SYNC feedback signal to control the DCO to provide a zero delay SYNC output signal. The output SYNC signal and the SYSCLK signal control a time of day counter in the line card.

23 Claims, 8 Drawing Sheets

(58) Field of Classification Search
USPC .................. 375/216, 354, 356, 374, 376
See application file for complete search history.

(56) References Cited

U.S. PATENT DOCUMENTS

| | | | |
|---|---|---|---|
| 5,644,604 | A | 7/1997 | Larson |
| 5,964,880 | A | 10/1999 | Liu |
| 6,549,046 | B1 | 4/2003 | Klecka, III |
| 6,760,586 | B1 | 7/2004 | Lee |
| 6,839,858 | B1 | 1/2005 | James |
| 6,885,647 | B1 | 4/2005 | Chung et al. |
| 7,002,996 | B1 | 2/2006 | Dougherty et al. |
| 7,079,589 | B1 | 7/2006 | Maksimovic |
| 7,116,743 | B1 | 10/2006 | Wang |
| 7,203,227 | B1 | 4/2007 | Currivan |
| 7,417,510 | B2 | 8/2008 | Huang |
| 7,451,337 | B1 | 11/2008 | Hewitt |
| 7,451,339 | B2 | 11/2008 | Smith, Sr. |
| 7,535,893 | B1 | 5/2009 | Beladakere et al. |
| 7,860,205 | B1 | 12/2010 | Aweya et al. |
| 7,903,681 | B2 | 3/2011 | Roberts et al. |
| 8,355,476 | B2 | 1/2013 | Lee |
| 8,942,561 | B2 | 1/2015 | Boyd et al. |
| 9,246,615 | B2 | 1/2016 | Ellegard et al. |
| 9,369,270 | B1* | 6/2016 | Spijker ............... H04J 3/0641 |
| 9,426,762 | B2 | 8/2016 | Ehlers et al. |
| 9,479,182 | B1 | 10/2016 | Baidas |
| 9,594,396 | B2 | 3/2017 | Turner et al. |
| 9,628,255 | B1 | 4/2017 | Baidas |
| 9,665,121 | B2 | 5/2017 | Aweya |
| 9,673,970 | B1 | 6/2017 | Aweya et al. |
| 9,860,004 | B2 | 1/2018 | Joergensen |
| 9,960,873 | B2 | 5/2018 | Yang |
| 10,007,639 | B2 | 6/2018 | Mitric |
| 10,075,284 | B1 | 9/2018 | Rodrigues et al. |
| 10,084,559 | B1 | 9/2018 | Devineni |
| 10,158,444 | B1 | 12/2018 | Darras |
| 10,511,312 | B1 | 12/2019 | Pastrello et al. |
| 10,536,258 | B2 | 1/2020 | Choo et al. |
| 10,594,423 | B1 | 3/2020 | Anand et al. |
| 10,715,307 | B1 | 7/2020 | Jin |
| 10,727,845 | B1 | 7/2020 | Balakrishnan |
| 10,797,686 | B1 | 10/2020 | Terstrup et al. |
| 10,917,097 | B1 | 2/2021 | Meyer et al. |
| 10,951,216 | B1 | 3/2021 | Barnette |
| 11,061,432 | B2 | 7/2021 | Sarda |
| 11,088,816 | B1 | 8/2021 | Sarda |
| 11,088,819 | B1 | 8/2021 | Sarda |
| 11,290,250 | B2* | 3/2022 | Sarda ................. H03L 7/07 |
| 2006/0020733 | A1 | 1/2006 | Sarda |
| 2006/0280182 | A1 | 2/2006 | Williams |
| 2007/0046516 | A1 | 3/2007 | Dombusch |
| 2008/0080563 | A1 | 4/2008 | Kataria |
| 2008/0240169 | A1 | 10/2008 | Cui et al. |
| 2009/0024865 | A1 | 1/2009 | Fugaro |
| 2009/0168808 | A1 | 7/2009 | Cho |
| 2009/0251226 | A1 | 10/2009 | Kathuria et al. |
| 2010/0118894 | A1 | 5/2010 | Aweya et al. |
| 2011/0296226 | A1 | 12/2011 | Sorbara et al. |
| 2012/0300795 | A1 | 11/2012 | Joergensen |
| 2012/0319734 | A1 | 12/2012 | Nagaraj |
| 2013/0121347 | A1 | 5/2013 | Saito et al. |
| 2014/0068315 | A1 | 3/2014 | Aweya et al. |
| 2014/0320181 | A1 | 10/2014 | Mitric |
| 2015/0092797 | A1 | 4/2015 | Aweya |
| 2015/0185759 | A1 | 7/2015 | Hinderer et al. |
| 2015/0200770 | A1 | 7/2015 | Rahbar et al. |
| 2015/0207620 | A1 | 7/2015 | Colby |
| 2015/0222276 | A1 | 8/2015 | Milijevic |
| 2015/0326232 | A1* | 11/2015 | Rahbar ................. H03L 7/099 327/156 |
| 2016/0170439 | A1 | 6/2016 | Aweya |
| 2016/0182217 | A1 | 6/2016 | Hashizume |
| 2017/0135053 | A1 | 5/2017 | Shenoi et al. |
| 2017/0288801 | A1 | 10/2017 | Aweya |
| 2017/0373824 | A1 | 12/2017 | Mitchler |
| 2019/0020333 | A1 | 1/2019 | Koch et al. |
| 2019/0036804 | A1 | 1/2019 | Mihelic et al. |
| 2019/0379474 | A1 | 12/2019 | Coulter |
| 2019/0379475 | A1* | 12/2019 | Seethamraju ......... H04J 3/0667 |
| 2020/0021379 | A1 | 1/2020 | Aweya |
| 2020/0028666 | A1 | 1/2020 | Goldin et al. |
| 2020/0050575 | A1 | 2/2020 | Mishra |
| 2020/0127752 | A1 | 4/2020 | Tai et al. |
| 2020/0280749 | A1* | 9/2020 | Nakamura ......... H04N 21/4305 |
| 2020/0285265 | A1 | 9/2020 | Rananathan et al. |
| 2021/0157355 | A1 | 5/2021 | Sarda et al. |
| 2021/0297083 | A1 | 9/2021 | Nishikawa |
| 2021/0328758 | A1 | 10/2021 | Sarda |

FOREIGN PATENT DOCUMENTS

| | | |
|---|---|---|
| CN | 104378193 | 2/2015 |
| CN | 107294634 | 10/2017 |
| WO | 2015003364 | 1/2015 |

OTHER PUBLICATIONS

Broadcom Corp., "Ethernet Time Synchronization Providing Native Timing Within the Network," White Paper, Oct. 2008, 36 pages.

Eidson, J., "IEEE-1588 Standard for a Precision Clock Synchronization Protocol for Networked Measurement and Control Systems," Agilent Technologies, 2005, 94 pages.

Gallant, D., "Practical Implementation of a IEEE 1588 Based Synchronization Distribution System," Silicon Laboratories, WSTS Jun. 19, 2018, 15 pages.

International Telecommunication Union, G.8273/Y.1368 (2018)—Amendment 1, Framework of phase and time clocks, ITU-T, Mar. 2020 (Year 2020) 38 pages.

Renesas, "Synchronization Management Unit," 8A34002 Datasheet, Renesas Electronics Corporation, Sep. 8, 2020, 107 pages.

Renesas, 82P33831, Synchronization Management Unit for IEEE 1588 and 10G/40G/100G Synchronous Ethernet, Jul. 10, 2018 (Year 2018) 75 pages.

Renesas, AN-1033, "Delay Variation Measurement and Compensation", Aplication Note, Feb. 8, 2019 (Year 2019) 13 pages.

Renesas, AN-950, "82P338XX/9XX Usage of a SYNC Input for Clock Alignment", Application Note, Nov. 10, 2016 (Year: 2016) 13 pages.

Silicon Labs, "UG103.05: IoT Endpoint Security Fundamentals," silabs.com, Rev. 1.2, downloaded Oct. 22, 2020, 12 pages.

Stanton, K., 802.1AS Tutorial, Intel Corporation, Nov. 13, 2008, 42 pages.

U.S. Appl. No. 17/375,634, filed Jul. 14, 2021, entitled "Data Protocol Over Clock Line," by Vivek Sarda.

U.S. Appl. No. 17/134,818, filed Dec. 28, 2020, entitled FSYNC Mismatch Tracking, by Vivek Sards.

* cited by examiner

PHASE TRANSPORT WITH FREQUENCY TRANSLATION WITHOUT A PLL

CROSS-REFERENCE TO RELATED APPLICATION(S)

This application is a continuation of U.S. patent application Ser. No. 16/849,036, filed Apr. 15, 2020, entitled "Phase Transport with Frequency Translation Without a PLL", naming Vivek Sarda as inventor, which application is incorporated herein by reference.

This application relates to the application entitled "Secondary Phase Compensation Assist for PLL IO Delay", naming Vivek Sarda as inventor, patent application Ser. No. 16/836,706, filed Mar. 31, 2020, which application is incorporated herein by reference in its entirety.

BACKGROUND

Field of the Invention

This invention relates to network timing and more particularly to transporting and generating clock signals in networks.

Description of the Related Art

Network communication boxes use timing protocols to ensure that time of day (ToD) counters in the network are synchronized. The synchronization is achieved using SYNC signals to update time of day counters at the same time in the network. Traditionally, a timing card distributes a Synchronous Ethernet (SyncE) clock signal, a SYSCLK clock signal, and a SYNC signal over a backplane to the slave line card and the various master line cards in the network box.

SUMMARY OF EMBODIMENTS OF THE INVENTION

Embodiments described herein eliminate the need to distribute the SYSCLK clock signal from the master timing card to all of the line cards over the backplane of the network box. Instead, the SYSCLK is generated using a digitally controlled oscillator that receives a timing signal from the SyncE phase-locked loop on the line card and a control signal from control logic on the line card.

In an embodiment, a method includes receiving an input clock signal at a line card and generating a first output clock signal using a phase-locked loop and supplying a clock signal from the phase-locked loop to a digitally controlled oscillator. The method further includes receiving a SYNC input signal at the line card and generating a control signal for the digitally controlled oscillator, based in part on the SYNC input signal. The method further includes generating a second output clock signal using the digitally controlled oscillator and dividing the second output clock signal to generate a SYNC output signal. A time of day counter is updated using the SYNC output signal and the second output clock signal.

In another embodiment an apparatus includes an input terminal to receive a SYNC input signal. A phase-locked loop is coupled to receive an input clock signal and to generate a first output clock signal. A digitally controlled oscillator is coupled to the phase-locked loop and the digitally controlled oscillator supplies a second output clock signal. A divider circuit divides the second output clock signal to generate a SYNC output signal. A time of day counter is coupled to the SYNC output signal and to the second output clock signal, and updates a time of day count value in synchronism with the SYNC output signal. Compare logic determines a time difference between a SYNC feedback signal and the SYNC input signal and control logic adjusts a timing of the second output clock signal based on the time difference.

In another embodiment, a line card includes an input terminal to receive a SYNC input signal and a phase-locked loop coupled to receive an input clock signal and to generate a first output clock signal. A digitally controlled oscillator is coupled to the phase-locked loop, the digitally controlled oscillator to supply a second output clock signal. A divider circuit divides the second output clock signal to generate a SYNC output signal. A time of day counter is coupled to the second output clock signal and is responsive to update a time of day count value in synchronism with the SYNC output signal. Compare logic compares the SYNC input signal and a SYNC feedback signal and provides a time difference and control logic adjusts a timing of the second output clock signal based, at least in part on the time difference. A timing card supplies the input clock signal and the SYNC input signal and a backplane is coupled to the line card and the timing card. The input clock signal and the SYNC input signal are transmitted through the backplane from the timing card to the line card.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
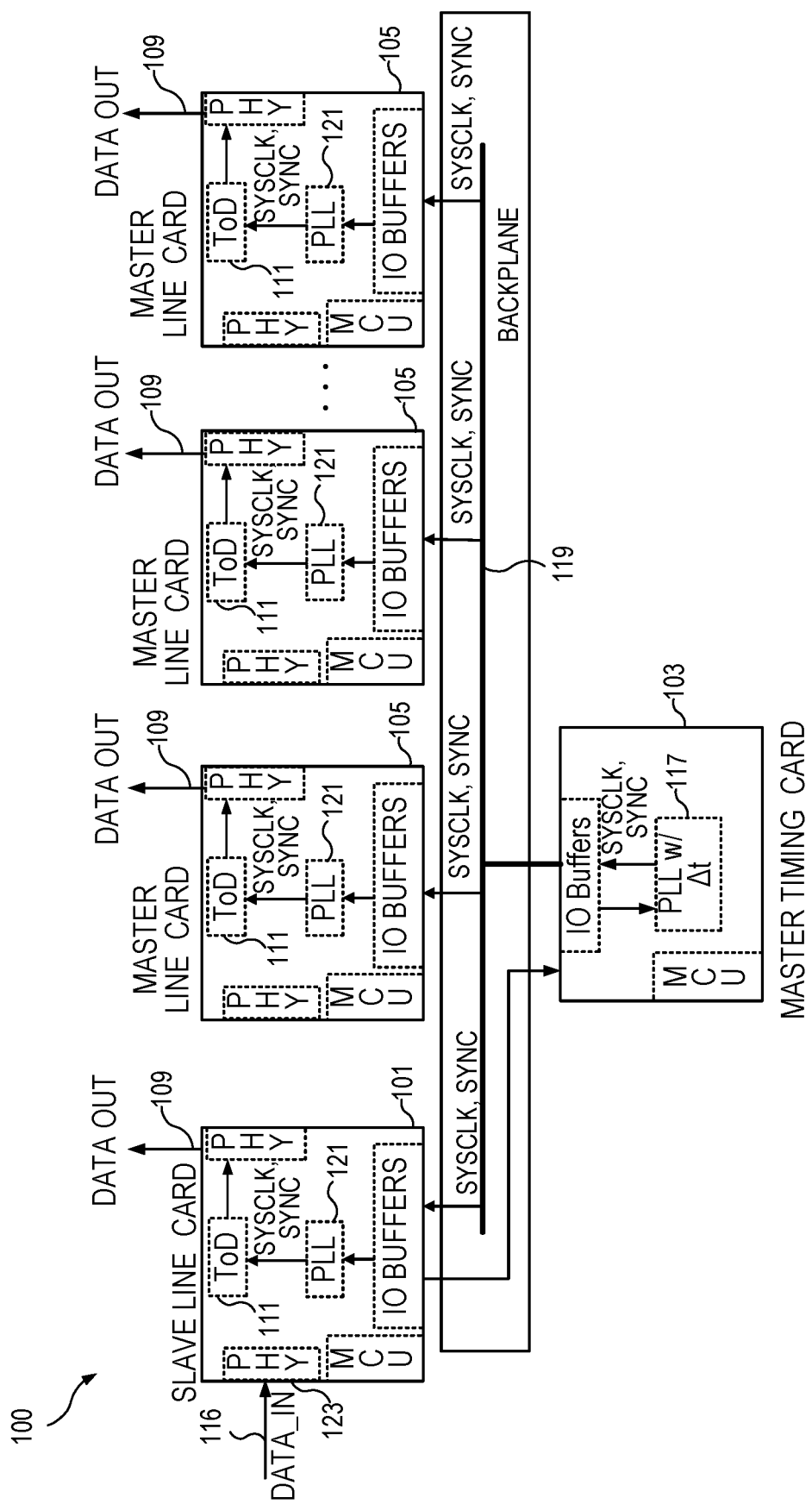
FIG. 1 illustrates a typical communication network box with a slave line card (LC), a master timing card (TC), and multiple master line cards coupled through a backplane.

FIG. 1 shows a typical architecture of communication network box 100 with a slave line card (LC) 101, a master timing card (TC) 103, and multiple master line cards 105. The data_out 109 from each line card is time stamped using time stamps from local Time of Day (ToD) counters 111. One challenge is to keep the ToD on the slave line card in alignment with the network timestamps from the incoming data stream on data_in 116. Another challenge is to maintain the ToD counters across different line cards in alignment over process, voltage, and temperature (PVT) variations so that all data_out 109 with their time stamps are aligned with each other and the incoming network time supplied on data_in 116.

The master timing card 103 supplies a SYNC signal and system clock signal (SYSCLK) to the slave line card 101 generated using PLL 117 and dividers (not shown). The SYNC signal is also referred to as the FSYNC (frame sync) signal in certain contexts as the signal has different names (SYNC or FSYNC) at the system level or integrated circuit level inside the network box. The signal will be referred to as the SYNC signal herein for ease of reference. The master timing card 103 also supplies the SYSCLK and SYNC signal to all of the master line cards 105 over backplane 119. The SYNC signal is a global signal inside the network system box 100 that signifies the right moment/edge for the Time of Day (ToD) counters 111 to rollover. The SYNC signal has a frequency range of 1 kHz to pp2s (pulse per 2 seconds). In many network systems the SYNC signal is 1 pulse per second (1PPS). SYNC is an integer divided down and edge aligned version of the system clock signal SYSCLK. The SYNC output from the master timing card (TC) is the global SYNC used by all the line cards (LC) for their ToD rollover alignment. The various ToD counters 111 contain the same value and turnover at the same time based on the SYNC signal. Each of the line cards 101 and 105 generate the SYNC signal by dividing the SYSCLK generated by PLL 121 in a divider (not shown in FIG. 1) to the desired frequency.

Figure 2:
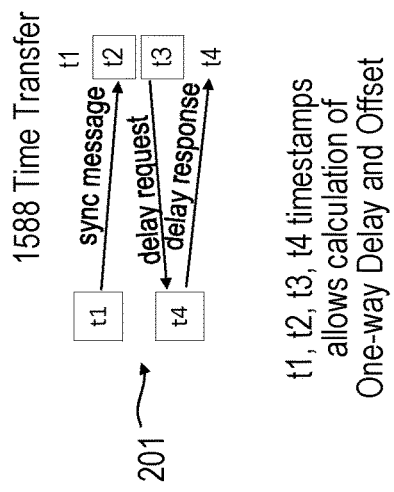
FIG. 2 illustrates an example of a time stamp exchange.

The exact position of the SYNC edge is derived using a precision time protocol (PTP) servo loop that uses the time information inside the incoming Synchronous Ethernet (SyncE) packet stream to the slave line card 101. FIG. 2 illustrates an example of a time stamp exchange 201 between an upstream PHY and the downstream PHY (e.g. PHY 123 in FIG. 1). Each of the time stamps t1-t4 represents the departure time (t1, t3) or the receive time (t2, t4). The timestamps exchange allows determination of one-way delay (OWD) and error offset between the upstream PHY and the downstream PHY shown at 203. That time stamp exchange allows the slave line card to determine the correct time provided by the upstream PHY even with delays between the upstream PHY and the downstream PHY. Note that the high level description of the PTP servo loop is provided as background information to provide context in which various embodiments described herein can be utilized.

The slave line card and the master timing card also have a closed loop PTP servo system in accordance with the IEEE 1588 protocol that corrects the position of the SYNC signal over process, voltage, and temperature (PVT) and aligns the SYNC signals distributed by the master timing card 203 to the time stamps of the incoming packet stream to the slave line card. The servo loop ensures that the slave line card and the master timing card are synchronized. The slave line card 101 and the master timing card 103 exchange information in the closed loop system to adjust the CLK and SYNC pair on the master timing card such that the slave line card ToD is aligned with the network ToD of the chosen incoming data stream on data_in 116. The PTP servo loop adjusts the timing of SYNC by adjusting PLL 117 so that the slave line card ToD is aligned in frequency and phase to the upstream ToD received by the slave line card on data_in 116. The distributed SYSCLK is supplied as a reference clock to the PLL 121 within each of the line cards and the line card PLLs generate a local SYSCLK and SYNC signal that is phase and frequency aligned with the distributed SYSCLK and SYNC signal. The master line cards 105 are duplicates (up to 64 copies) of the slave line card 101 but without the closed loop PTP servo loop. In other words, the distribution of the CLK/SYNC pair to the master line cards 105 is open loop (without the PTP closed loop adjustments).

Figure 3:
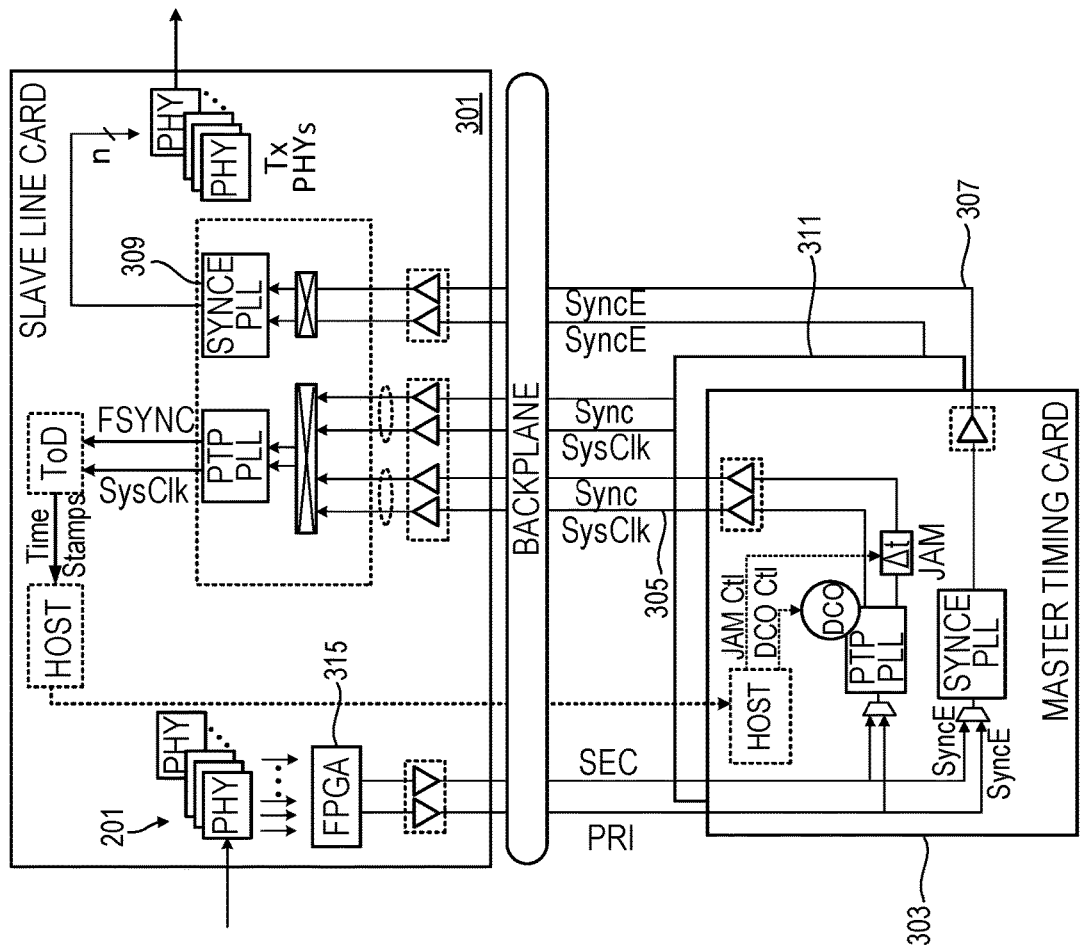
FIG. 3 illustrates additional details of a slave line card and a master timing card.
Figure 5:
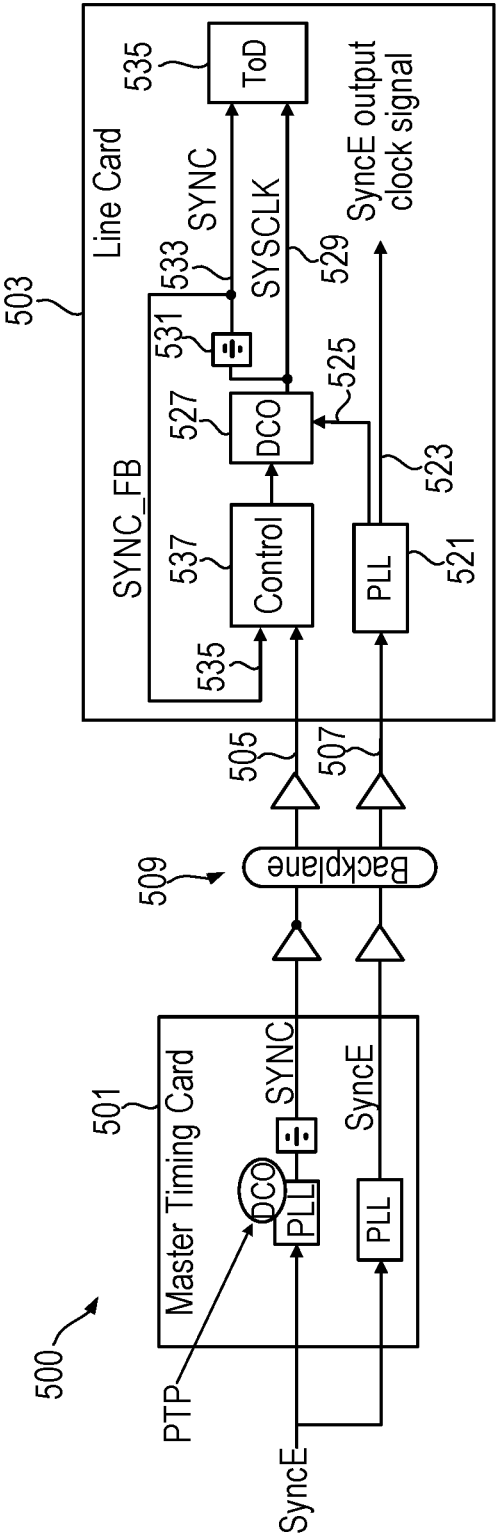
FIG. 5 illustrates a high level block diagram of a network box that distributes the SyncE clock signal and the SYNC signal over the backplane (without a SYSCLK) and regenerates the SYSCLK clock signal on the line card using a digitally controlled oscillator (DCO).

Referring to FIG. 3 additional aspects of the slave line card 301 and the master time card 303 are shown. In addition, to generating the SYSCLK 305, the master time card generates a Synchronous Ethernet (SyncE) clock signal 307. The SyncE clock signal is supplied to SyncE PLL 309 in the slave line cards so that the local SyncE clock signals are frequency and phase locked to the SyncE clock signal in the master timing card. Embodiments include a slave timing card 311 that functions as a backup timing card to the master timing card 303 by providing backup SYNC, SYSCLK, and SyncE signals. The FPGA 315 is part of the PTP loop and in an embodiment includes an MCU to implement PTP software. PRI and SEC are primary and secondary data streams to select from for determining the network time. SEC is a backup of PRI. The master timing card 303 receives input SyncE clock signals from the PHYs of line card 301. The host MCU picks two PHYs and designates one of them as PRI (primary) and another as SEC (secondary) clocks that are supplied to the master timing card and also to the slave backup timing card 311. SEC is backup for PRI. The SyncE clocks are from two different sources but only one is used at any given time (as shown in FIG. 5). Switching from PRI to SEC or vice versa is managed by hitless switching inside the PTP and SyncE PLLs.

The PTP PLLs in the slave line card and the master timing card are used to adjust the SYSCLK (and SYNC) based on the PTP servo loop. The various time stamps required for the PTP servo loop are exchanged between the hosts on the slave line card and the master timing card. The hosts are microcontroller units (MCUs) or field programmable gate arrays (FPGAs) with some processing and communication abilities. The digitally controlled oscillator (DCO) in the master timing card 303 adjusts the phase of the SYNC and SYSCLK in accordance with the calculations of the PTP servo loop so that the SYNC at the ToD counter on the slave line card occurs at the desired time.

Figure 4:
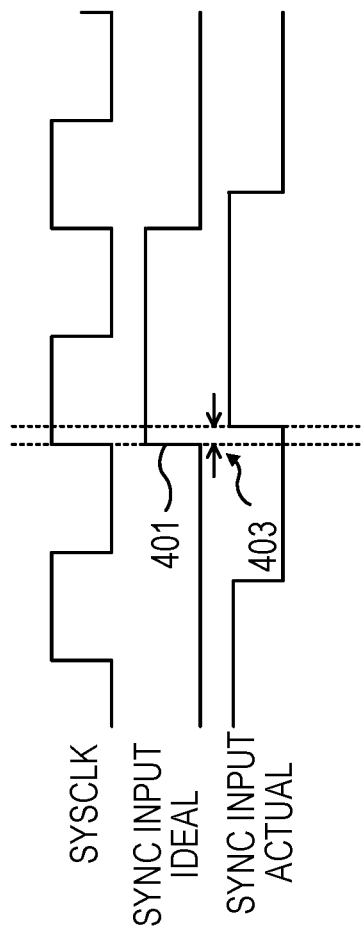
FIG. 4 illustrates how SYSCLK and SYNC can be misaligned on receipt at the line card.

Referring to FIG. 4, the timing diagram illustrates that the SYSCLK input signal and SYNC input signal received at the line card may be misaligned. Ideally, the SYNC input signal is aligned at 401 with the SYSCLK input signal. However, due to variations in delays associated with transmit and receive buffers and the backplane traces, the actual SYNC input signal received at the line card may be misaligned with respect to the SYSCLK as shown at 403.

FIG. 5 illustrates one approach to avoid misalignment between the SYSCLK signal and the SYNC signal received at the line card from the timing card. The embodiment has the advantage of fewer routings through the backplane and fewer pins needed on the timing cards and the line cards. The embodiment of the network box 500 illustrated in FIG. 5 avoids distributing the SYSCLK signal from the master timing card 501 to the line card (slave or master) 503. Instead, the master timing card supplies the SYNC signal 505 and the SyncE clock signal 507 through the backplane 509 and rebuilds the SYSCLK signal with the correct frequency and phase based on the SYNC signal. In an embodiment master timing card 501 generates the SYNC signal 505 using the PTP loop described earlier to ensure the SYNC signal is synchronized with the upstream SYNC signal. The line card includes a PLL 521 that receives the SyncE clock signal from the master timing card 501 supplied over the backplane as a reference clock signal and generates a SyncE output clock signal 523. In addition, the PLL 521 supplies a clock signal 525 to digitally controlled oscillator 527. The digitally controlled oscillator 527 generates the output SYSCLK clock signal 529 with the appropriate phase and frequency. A digitally controlled oscillator supplies an output signal with a phase and frequency determined according to a digital control signal. Divider 531 divides the SYSCLK clock signal to generate the SYNC output signal 533. The ToD counter 535 receives the SYSCLK and SYNC signals and updates synchronously with the other ToD counters in the network box. The ToD counter 535 is clocked by SYSCLK. The ToD counter increments a fixed amount between two SYNC signals with the fixed amount depending on the frequency relationship between the SYNC and SYSCLK signals. The various ToD counters in the line cards in the network box roll over, e.g., in response to a 1 PPS SYNC signal, in synchronism with respective SYNC signals in the line cards. The ToD counters provides the timestamp (also known as wall time in the line card) for the line cards. The control logic 537 determines the appropriate control signals for the digitally controlled oscillator 527 to generate the SYSCLK signal 529 with the right frequency and phase. Using a digitally controlled oscillator to generate SYSCLK has the added advantage, depending on the implementation, of eliminating a PLL from the line card.

Figure 6:
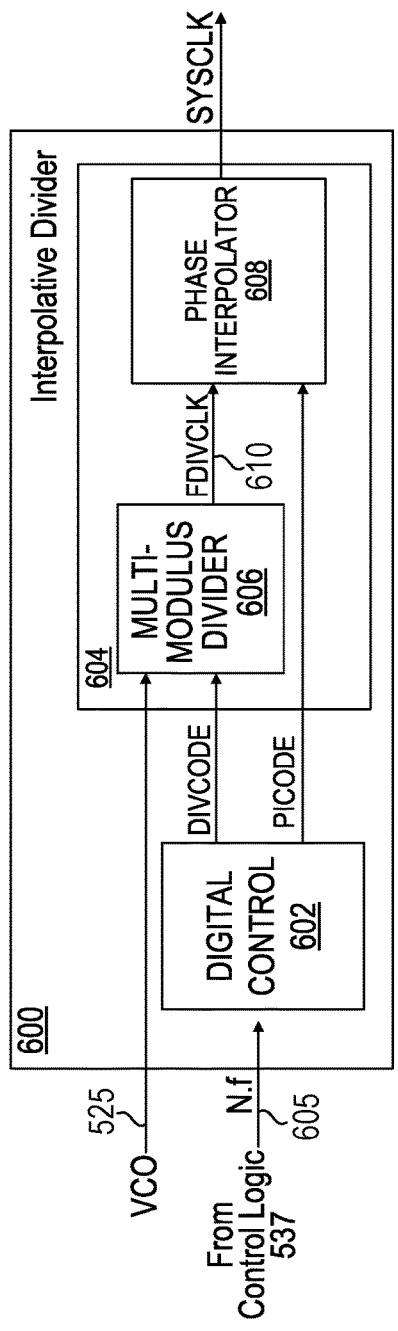
FIG. 6 illustrates a high level block diagram of an interpolative divider that is used as the DCO in one or more embodiments.

In at least one embodiment as illustrated in FIG. 6, the DCO 527 is implemented as interpolative divider 600. The interpolative divider 600 receives a high frequency clock signal 525 from the voltage controlled oscillator (VCO) of the SyncE PLL 521. The interpolative divider 600 divides the VCO signal 525 to a desired frequency and phase as described below. In an embodiment, the VCO signal is 10 GHz but higher or lower VCO frequencies are used in other embodiments. Digital control circuit 602 generates digital control signals for circuit 604 of interpolative divider 600 based on the control signal 605 from control logic 537 that indicates a divide value that is typically a non integer value N.f, where N is an integer and f is a fractional portion of the divide value. The circuit 604 includes multi-modulus divider 606 and phase interpolator 608. Digital control circuit 302 generates sequences of corresponding DIVCODE and PICODE control codes that control multi-modulus divider 606 and phase interpolator 608, respectively. In an embodiment, digital control circuit 602 includes a first order delta signal modulator that generates a stream of integers that approximate the desired frequency of SYSCLK. Thus, digital control circuit 602 provides the integer portion of the divide value to generate SYSCLK to multi-modulus divider 606 and supplies the digital quantization error as control code PICODE to phase interpolator 608. In an embodiment, multi-modulus divider 606 is an integer frequency divider that counts down an integer number of corresponding edges of input clock signal 525, as indicated by digital control code DIVCODE, before generating a corresponding output edge of frequency-divided clock signal FDIVCLK 610. Phase interpolator 608 interpolates between frequency-divided clock signal FDIVCLK 610 and one or more delayed versions of frequency-divided signal FDIVCLK (e.g., one or more equally spaced phases of frequency-divided clock signal FDIVCLK, equally spaced by an entire period of input clock CLKVCO) based on control code PICODE, which corresponds to the phase error, using techniques that are well known in the art.

In an embodiment, phase interpolator 608 generates multiple equally spaced phases of frequency-divided clock signal FDIVCLK and interpolates appropriate ones of those phases to generate the output clock signal SYSCLK. Interpolation techniques are well known in the art. Other interpolator implementations may be used based on such factors as the accuracy required, power considerations, design complexity, chip area available, and the number of bits used to represent the digital quantization error.

In at least one embodiment, phase interpolator 608 delays frequency-divided clock signal FDIVCLK by selecting from 256 equally spaced phases of the frequency-divided clock signal according to the value of control code PICODE. For example, control code PICODE may have F bits (e.g., F=8), corresponding to $P=2^F$ (e.g., P=256) different $PICODE_i$ (e.g., $0 \leq i \leq P-1$), which correspond to P different delay values. A maximum delay is introduced by control code PICODE (e.g., $PICODE_{P-1}$) corresponding to a target maximum delay of almost one cycle of input clock signal CLKVCO (e.g., a delay of 255/256×the period of input clock signal CLKVCO). The target delay increment (i.e., a delay difference between consecutive PICODES, e.g., the delay difference between control code PICODE and control code $PICODE_{i+1}$, where $0 \leq PICODE_i < PICODE_{P-1}$) is one cycle of input clock signal CLKVCO cycle divided by P. An exemplary interpolative divider is further described in U.S. Pat. No. 7,417,510 filed Oct. 17, 2006, entitled "Direct Digital Interpolative Synthesis," naming Yunteng Huang as inventor, which patent is incorporated herein by reference in its entirety.

In at least one embodiment of phase interpolator 608, target performance is achieved by converting a phase interpolator code to analog phase interpolator control signals using a current digital-to-analog converter. First-order noise-shaping dynamic-element-matching encoding techniques are used to convert control code PICODE, which may be periodic, to a plurality of digital control signals that are provided to circuit 604. Circuit 604 includes a digital-to-analog converter that converts those control signals to individual analog control signals and provides the analog control signals to current sources in phase interpolator 608.

Figure 7:
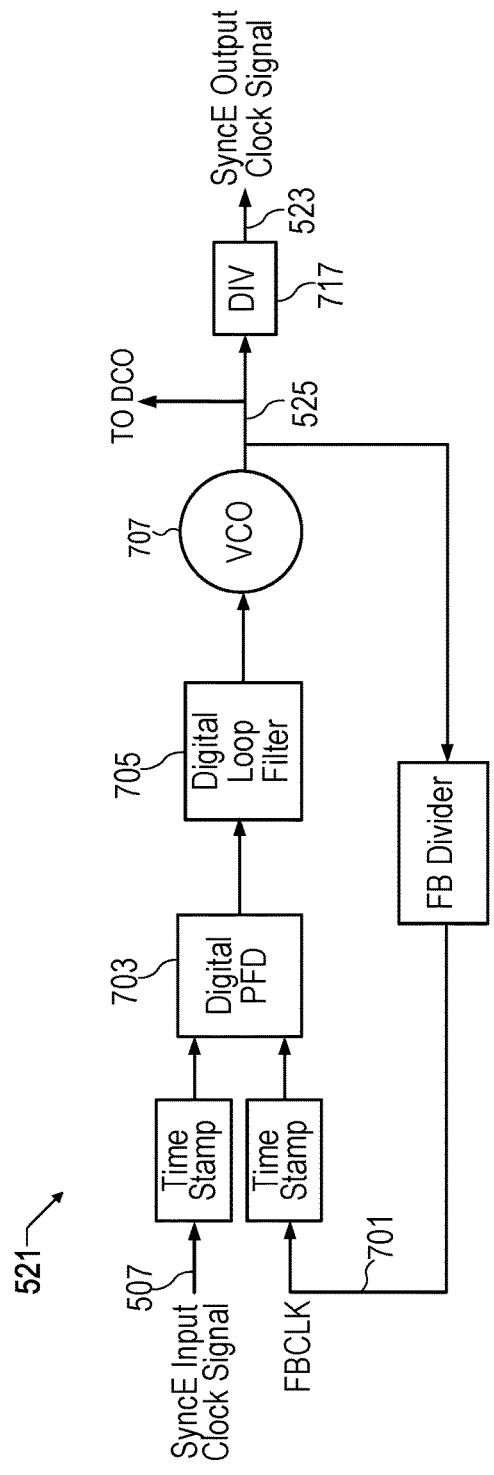
FIG. 7 illustrates a high level block diagram of a line card PLL used to generate the SyncE clock signal.

FIG. 7 illustrates a high level block diagram of an embodiment of the line card SyncE PLL 521. The PLL 521 receives the SyncE input signal 507 as the reference clock signal. The reference clock 507 is compared to the feedback clock 701 in phase and frequency detector 703, which supplies the phase difference to the loop filter 705. The loop filter output controls the VCO 707. The output 525 of the VCO 707 is supplied to the DCO 527. One or more divider stages 717 divides the VCO output signal to generate the SyncE clock signal used to drive the PHY. Note that the SyncE clock signal does not utilize the PTP loop utilized by the SYNC signal. In an embodiment, substantial portions of the PLL 521 are implemented digitally. Thus, the SyncE input signal 507 and the feedback clock signal 701 are time stamped and the time stamps compared digitally to determine the phase error. Other embodiments utilize PLLs with more analog circuitry.

Referring back to FIG. 5, the control logic 537 determines the control signal supplied to the interpolative divider based on the SYNC signal received from the master timing card 501. In an embodiment, the control logic is implemented in firmware on a microcontroller to achieve the functionality described herein. In other embodiments, the control logic is implemented in discrete control logic, or a combination of firmware and other control logic. In an embodiment, the control logic time stamps the receipt of the SYNC signal, e.g., the active edge or both the rising and falling edges. The SYNC signal frequency is known and can be stored or updated in non volatile memory accessible to the control logic 537. For example, the SYNC signal frequency may equal to 1 PPS or 1 KHz. In addition, the nominal frequency of the SYSCLK is also known. Based on the nominal frequency of the SYSCLK clock signal, e.g., nominally 1 GHz, the control logic knows how many SYSCLK periods should be contained in a period of the SYNC signal. In that way, the control logic sets the DCO control value to achieve the desired number of SYSCLK periods. The control logic may know the nominal frequency of the SyncE clock signal VCO as well to reduce the time it takes for the interpolative divider to lock to the SYNC signal. The SYNC signal is carrying both frequency and phase information that was adjusted in the PTP loop and the information in the SYNC signal can be used to regenerate the SYSCLK signal with the right phase and frequency information in the line card using the interpolative divider.

Figure 8:
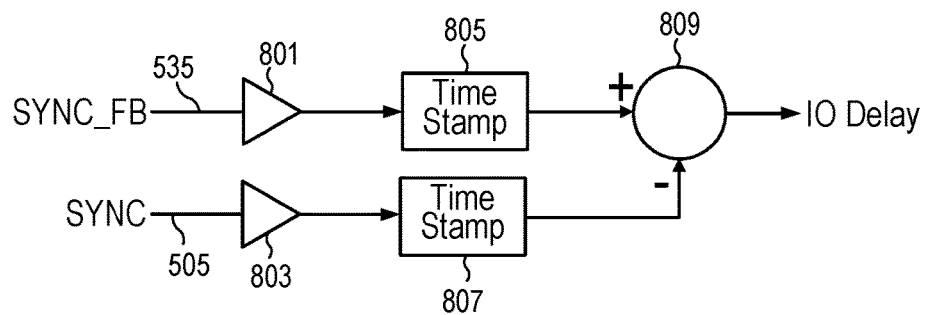
FIG. 8 illustrates logic to compare the SYNC signal and the SYNC_FB signal.

In addition, one or more embodiments, also remove input/output IO delay. Removal of IO delay in line cards which receive both a SYNC signal and a SYSCLK signal is described in detail in the application entitled "Secondary Phase Compensation Assist for PLL IO Delay", naming Vivek Sarda as inventor, patent application Ser. No. 16/836,706, filed Mar. 31, 2020. Referring to FIGS. 5 and 8, the generated SYNC output signal 533 is fed back as SYNC_FB 535 to the control logic 537. By feeding back the SYNC output signal, the control logic can keep the output SYNC signal phase and frequency the same as the input SYNC signal. In embodiments, the SYNC signal is fed back through buffer 801 (not shown in FIG. 5) and the SYNC signal is received through buffer 803. The two signals are time stamped in time stamp logic 805 and 807, respectively. The time stamp logic functions as a time to digital converter and converts the transitions of the SYNC_FB signal and the input SYNC signal to digital values based on an available timing reference. Difference logic 809 receives the two time stamps and determines the difference between the time stamps of SYNC_FB 535 and the currently valid SYNC signal 505 and supplies the difference, indicative of the IO delay. The control logic uses the IO delay to adjust the DCO to ensure that the SYNC output signal 533 has zero IO delay with respect to the SYNC input signal 505. That also ensures that any IO delay that would have been associated with a distributed SYSCLK signal over the backplane is also removed. The divider 531 is adjusted at startup for any phase jam. The divide ratio of divider 531 is fixed to the ratio between the SYNC and SYSCLK frequencies. During run time, the DCO (and not the divider) is adjusted since the SYNC PLL and SyncE PLL in the master timing card are running asynchronously. Since the DCO has the SyncE PLL VCO on the timing card as its timing source, the DCO needs to be corrected by the control logic to match the incoming SYNC frequency and phase.

The measured IO delay can include delay caused by input buffers, the DCO 527, the control logic 537, divide logic 531, and other clock tree buffers on the line card. The approach used in line card 503 is used on the slave line card and the master line cards in the network box to reduce mismatch. The approach has the advantage of reducing the number of signals that need to be distributed through the backplane. In addition, the PLL for SYSCLK, such as PLL 121, in FIG. 1 is omitted.

Figure 9:
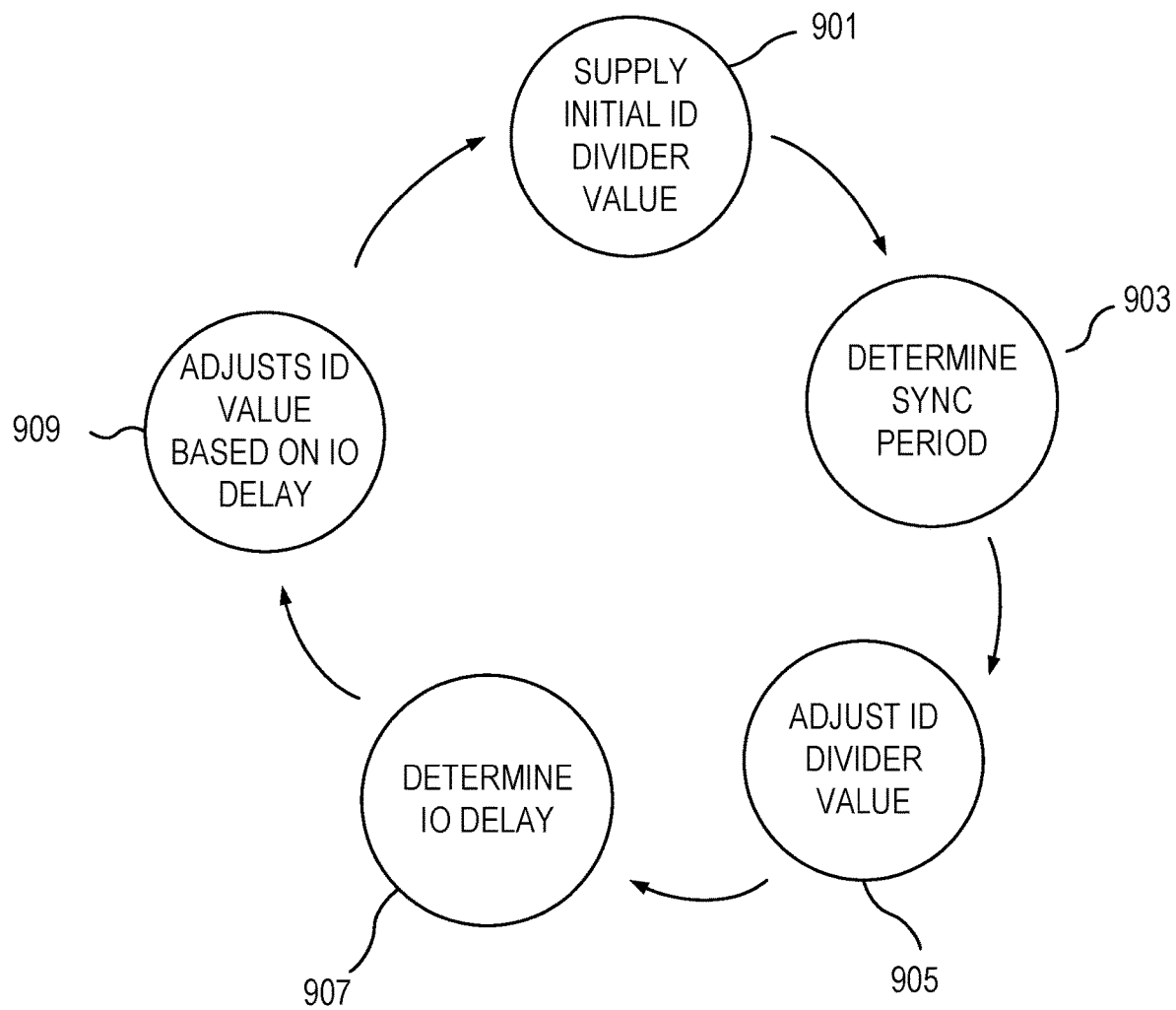
FIG. 9 illustrates a high level block diagram of control functionality to control the interpolative divider to generate the SYSCLK clock signal.

FIG. 9 illustrates a high level diagram of the control flow for control logic 537. In 901 the control logic supplies an estimated divider value to the interpolative divider based on expected frequency values of SYSCLK and the SyncE PLL VCO output signal. In 903 the control logic determines the period of SYNC based on successive active edges of the SYNC signal. In embodiments, the SYNC signal is time-stamped on receipt and successive time stamps used to determine the period. That period value is then used to adjust the initial (or previous) divide value supplied to the interpolative divider in 905 so the right number of SYSCLK periods occur in the SYNC period. There will be a known relationship between the frequency of SYSCLK and SYNC. For example, the SYNC signal may be 1 PPS and the SYSCLK frequency may be 1 GHz. Note that when dividing the SyncE PLL VCO output signal to achieve the desired number of SYSCLK signals, the divider value may not be an integer and thus the control logic supplies the interpolative divider a divide control signal N.f that includes a fractional portion if needed. Given the right N.f divider value, the interpolative divider divides the VCO output signal and generates an output clock signal with the desired SYSCLK frequency. The generated SYSCLK will then be phase and frequency aligned based on the period and time stamps of received SYNC signals. In addition, the control logic determines the IO delay in 907 and adjusts the interpolative divider in 909 to remove the IO delay from the SYNC output signal supplied to the ToD counter. That can be accomplished by adjusting the fractional portion of the interpolative divider control signal. In an embodiment, the control logic responds to every active edge of the received SYNC signal to ensure the SYNC and SYSCLK signal stay locked to the desired timing of SYNC. The IO delay can be determined every active edge of SYNC or less often if desired as IO delay is typically changing slowly. The IO delay adjustment in 909 may be combined with the adjustment in 905 rather than being done separately.

Figure 10:
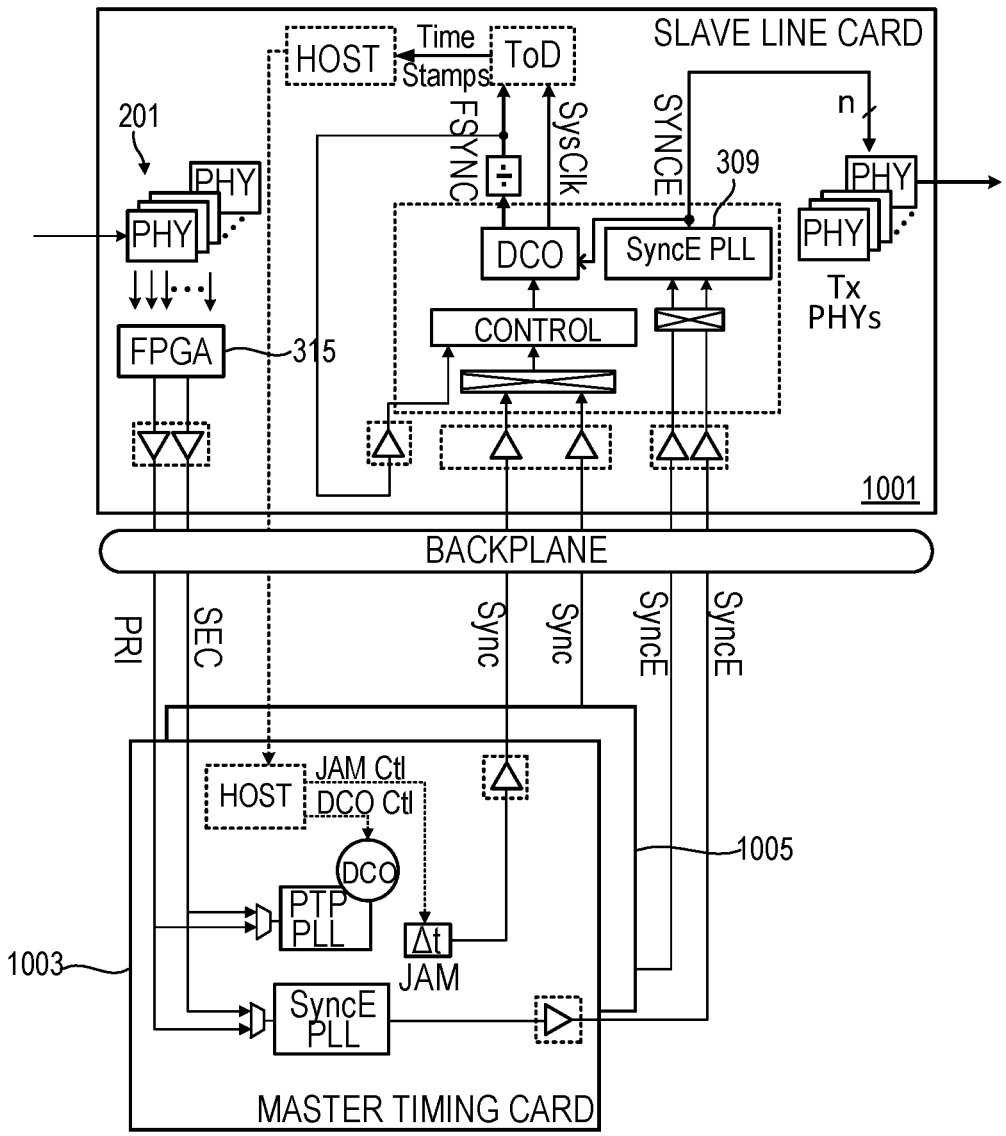
FIG. 10 illustrates a network box that includes a slave line card that generates the SYSCLK signal utilizing a digitally controlled oscillator, a master timing card, and backup timing card.

FIG. 10 illustrates a slave line card 1001 that generates the SYSCLK signal utilizing an interpolative divider as described above. FIG. 10 also shows the master timing card 1003 and backup timing card 1005 and the existence of the PTP loop between the slave line card and the master timing card.

Figure 11:
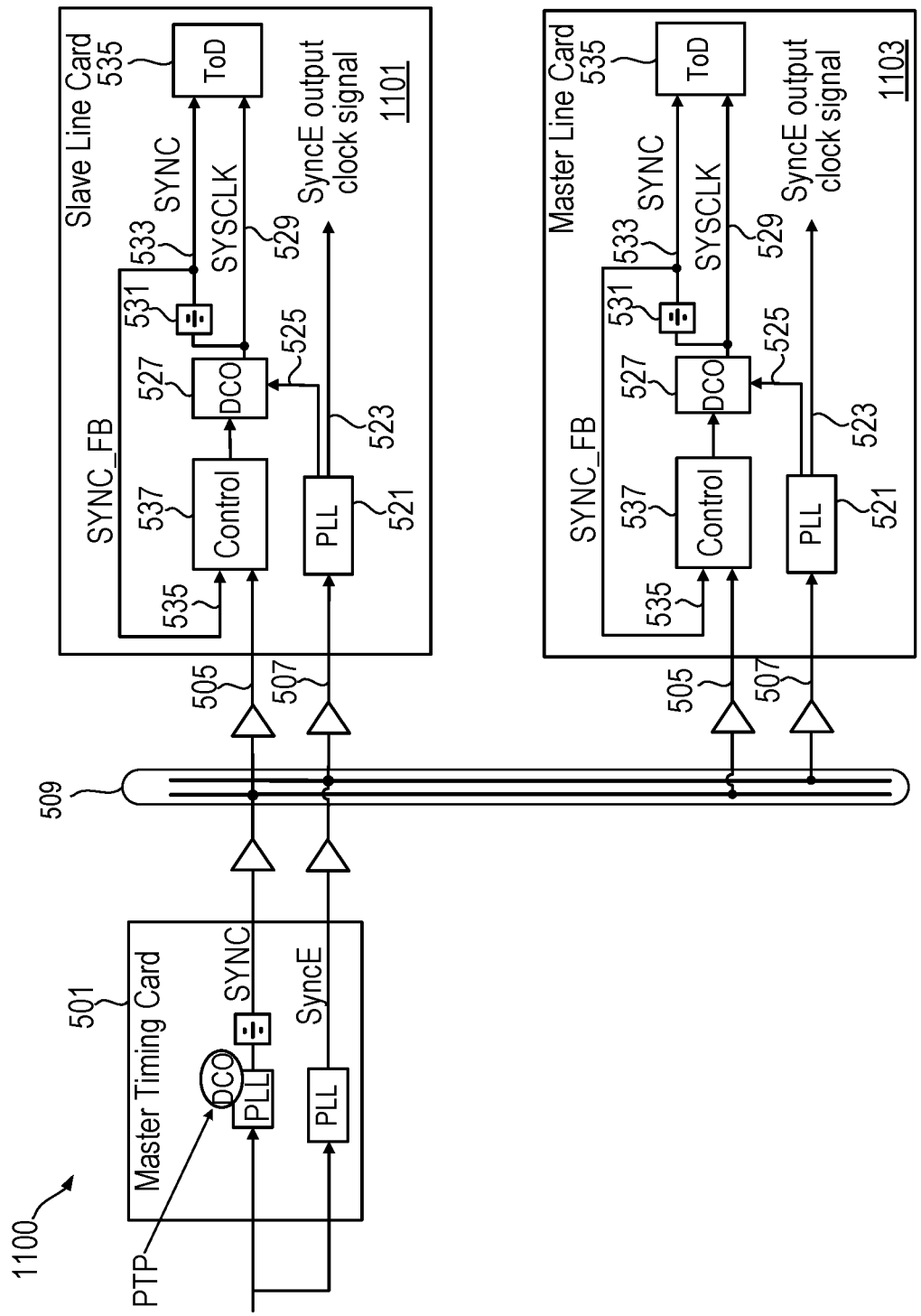
FIG. 11 illustrates an embodiment of a network box showing that the master timing card distributes the SYNC signal and the SyncE clock signal to the slave line card and to master line cards (but does not distribute the SYSCLK signal over the backplane).

FIG. 11 illustrates an embodiment of a network box 1100 showing that the master timing card 501 distributes the SYNC signal and the SyncE clock signal to the slave line card 1001 and to master line cards 1103 (only one of which is shown), thereby reducing the signal routing requirements for backplane 509.

Figure 12:
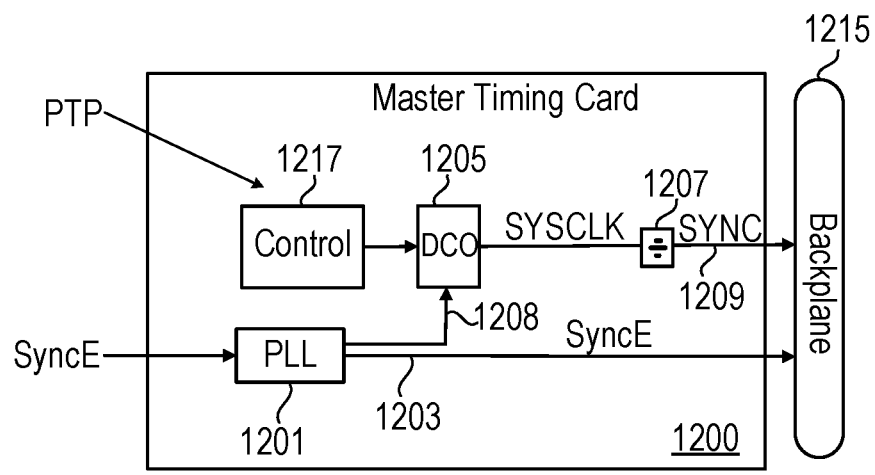
FIG. 12 illustrates an embodiment of a master timing card with a PLL to generate SyncE and a digitally controlled oscillator to generate SYSCLK.

In an embodiment as shown in FIG. 12, the master timing card 1200 also uses one PLL 1201 to generate the SyncE signal 1203 and an interpolative divider 1205 to generate SYSCLK and uses divider 1207 to generate the SYNC signal 1209 from SYSCLK. The PLL 1201 supplies a timing signal 1208 from the SyncE PLL VCO. The master timing card 1200 supplies the SYNC signal 1209 and the SyncE clock signal 1203 to the backplane 1215 to distribute to the line cards. The PTP loop with the slave line card (not shown in FIG. 12) interacts with the control logic 1217 to adjust the interpolative divider to ensure the SYNC signal 1209 is properly aligned with the timing of the upstream PHY coupled to the slave line card.

Thus, a network box has been described that eliminates the need to distribute SYSCLK and instead regenerates SYSCLK on each line card. The description of the invention set forth herein is illustrative and is not intended to limit the scope of the invention as set forth in the following claims. Variations and modifications of the embodiments disclosed herein may be made based on the description set forth herein, without departing from the scope of the invention as set forth in the following claims.

What is claimed is:

1. A method for synchronizing signals in a communication system comprising:
   receiving an input clock signal at a line card and generating a first output clock signal using a phase-locked loop;
   supplying the first output clock signal from the phase-locked loop to a digitally controlled clock generation circuit;
   receiving an input synchronization (SYNC) signal at the line card, the input synchronization signal being a global signal providing rollover alignment for time of day counters in the communication system;
   generating a control signal for the digitally controlled clock generation circuit, based in part on the input synchronization signal;
   generating a second output clock signal using the digitally controlled clock generation circuit;
   dividing the second output clock signal to generate an output synchronization signal having a frequency substantially equal to the input synchronization signal; and
   supplying a time of day counter with the output synchronization signal and the second output clock signal.

2. The method as recited in claim 1 further comprising:
   feeding back the output synchronization signal as a synchronization feedback signal;
   determining a time difference between the input synchronization signal and the synchronization feedback signal; and
   generating the control signal based, at least in part, on the time difference.

3. The method as recited in claim 2 further comprising adjusting timing of the second output clock signal based on the time difference to obtain a zero delay synchronization output signal such that the time difference between the input synchronization signal and the output synchronization signal is substantially zero.

4. The method as recited in claim 2 further comprising:
   generating a first time stamp associated with receipt of the input synchronization signal;
   generating a second time stamp associated with the synchronization feedback signal; and
   determining the time difference based on a difference between the first time stamp and the second time stamp.

5. The method as recited in claim 1 further comprising:
   supplying the digitally controlled clock generation circuit with a voltage controlled oscillator output signal from the phase-locked loop as the first output clock signal from the phase-locked loop; and
   dividing the voltage controlled oscillator output signal to generate a divided voltage controlled oscillator output signal and supplying the divided voltage controlled oscillator output signal as another output clock signal.

6. The method as recited in claim 1 wherein the digitally controlled clock generation circuit is an interpolative divider.

7. The method as recited in claim 6 further comprising supplying a divider circuit of the interpolative divider with the first output clock signal from the phase-locked loop.

8. The method as recited in claim 1 further comprising supplying the input synchronization signal and the input clock signal to the line card through a backplane.

9. The method as recited in claim 8 further comprising supplying the input synchronization signal and the input clock signal to the backplane from a timing card.

10. The method as recited in claim 1 further comprising:
    receiving the input clock signal at a second line card and generating a third output clock signal using a second phase-locked loop; and
    supplying the third output clock signal from the second phase-locked loop to a second digitally controlled clock generation circuit.

11. The method as recited in claim 10 further comprising:
    receiving the input synchronization signal at the second line card; and
    generating a second control signal for the second digitally controlled clock generation circuit based in part on the input synchronization signal.

12. The method as recited in claim 11 further comprising:
    generating a fourth output clock signal using the second digitally controlled clock generation circuit;
    dividing the fourth output clock signal to generate a second output synchronization signal having a frequency substantially equal to the input synchronization signal; and
    supplying a second time of day counter with the second output synchronization signal and the fourth output clock signal.

13. An apparatus for synchronizing timing in a network communication system comprising:
    a phase-locked loop coupled to an input clock signal and to generate a first output clock signal;
    a digitally controlled clock generation circuit coupled to receive the first output clock signal from the phase-locked loop and generate a second output clock signal, the second output clock signal being determined at least in part on an input synchronization signal, the input synchronization signal being a global signal providing rollover alignment for time of day counters in the network communication system;
    a divider circuit to divide the second output clock signal to generate an output synchronization signal for use by a time of day counter, the output synchronization signal having a frequency and phase substantially equal to the input synchronization signal;
    compare logic to determine a time difference between a synchronization feedback signal based on the output synchronization signal and the input synchronization signal; and
    control logic to adjust a timing of the second output clock signal based on the time difference.

14. The apparatus as recited in claim 13 wherein the input synchronization signal includes phase and frequency information derived from a precision time protocol servo loop.

15. The apparatus as recited in claim 13 wherein the digitally controlled clock generation circuit is an interpolative divider.

16. The apparatus as recited in claim 15 wherein a digital control signal for the digitally controlled clock generation circuit is based, at least in part, on the time difference.

17. The apparatus as recited in claim 13 further comprising a backplane through which the input synchronization signal and the input clock signal are supplied.

18. The apparatus as recited in claim 17 wherein the time of day counter is coupled to the output synchronization signal and to the second output clock signal and the time of day counter updates a time of day count value in synchronism with the output synchronization signal.

19. The apparatus as recited in claim 17 further comprising a timing card to supply the input synchronization signal and the input clock signal to the backplane.

20. The apparatus as recited in claim 17 further comprising a divide circuit coupled to divide an output of a voltage control oscillator of the phase-locked loop and supply another output clock signal.

21. A network communication system comprising:
   a first line card including an input terminal to receive an input synchronization signal, a phase-locked loop coupled to receive an input clock signal and to generate a first output clock signal, and a digitally controlled clock generation circuit coupled to receive the first output clock signal to supply a second output clock signal being frequency and phase aligned with the input synchronization signal, the input synchronization signal being a global signal providing rollover alignment for time of day counters in the network communication system;
   a divider circuit in the first line card to divide the second output clock signal to generate an output synchronization signal;
   a time of day counter in the first line card in coupled to receive the second output clock signal and configured to update a time of day count value in synchronism with the output synchronization signal;
   compare logic in the first line card to compare the input synchronization signal and a synchronization feedback signal and provide a time difference and control logic in the first line card to adjust a timing of the second output clock signal based, at least in part on the time difference;
   a timing card to supply the input clock signal and the input synchronization signal; and
   a backplane coupled to the first line card and the timing card, the input clock signal and the input synchronization signal being transmitted through the backplane from the timing card to the first line card.

22. The network communication system as recited in claim 21 further comprising a second line card.

23. The network communication system as recited in claim 22 wherein the second line card includes:
   a second input terminal to receive the input synchronization signal;
   a second phase-locked loop coupled to receive the input clock signal and to generate a third output clock signal;
   a second digitally controlled clock generation circuit coupled to receive the third output clock signal from the second phase-locked loop, the second digitally controlled clock generation circuit to supply a fourth output clock signal;
   a second divider circuit to divide the fourth output clock signal and generate a second output synchronization signal;
   a second time of day counter coupled to the second output synchronization signal and configured to update a second time of day count value in synchronism with the output synchronization signal;
   second compare logic to compare the input synchronization signal and a second synchronization feedback signal and provide a second time difference;
   second control logic to adjust a timing of the fourth output clock signal based, at least in part, on the time difference, the second line card being coupled to the backplane to receive the input synchronization signal and the input clock signal.

* * * * *